United States Patent [19]

Braun

[11] Patent Number: 5,010,303
[45] Date of Patent: Apr. 23, 1991

[54] BALANCED INTEGRATED CIRCUIT DIFFERENTIAL AMPLIFIER

[75] Inventor: Jeffrey J. Braun, Mesa, Ariz.

[73] Assignee: Motorola, Inc., Schaumburg, Ill.

[21] Appl. No.: 447,956

[22] Filed: Dec. 8, 1989

[51] Int. Cl.[5] .............................................. H03F 3/45
[52] U.S. Cl. ................................... 330/257; 330/259; 330/260
[58] Field of Search ................... 330/207 P, 257, 259, 330/260, 298

[56] References Cited

U.S. PATENT DOCUMENTS

| | | | |
|---|---|---|---|
| 4,574,221 | 3/1986 | Hess | 315/209 T |
| 4,780,625 | 10/1988 | Zobel | 307/350 |

FOREIGN PATENT DOCUMENTS 437193  12/1974  U.S.S.R. .............................. 330/259

OTHER PUBLICATIONS

Motorola Schematic 12/15/87 for SC74589P IS-C-BPA.

Primary Examiner—James B. Mullins
Attorney, Agent, or Firm—Phillip H. Melamed

[57] ABSTRACT

Integrated circuit amplifier (10) implements unity voltage gain and its current gain is determined by the ratio of integrated circuit resistors (R1, R2). Amplifier input stage (Q1, Q2, Q4–Q7) has a pair of transistors (Q4, Q5) connected as a differential amplifier. An output transistor (Q13) connected to the collector of one (Q4) of the differential transistors amplifies the differential signal from the input stage and provides an output signal (at terminal 22). Current mirror circuitry (Q12, Q9) develops a current mirror signal (at 24) corresponding to current drawn through the output transistor (Q13). A load balancing circuit (Q8, Q3, R8) includes a transistor (Q3) having an input terminal directly connected to and loading the collector of another one (Q5) of the differential transistors. This configuration results in equal impedance and current loading for each of the collectors of the differential transistors (Q4, Q5). This minimizes any offset variation for the differential signal at the collector of one of the transistors (Q4) as a function of the conduction of the output stage tansistor (Q13). This results in a more accurate true differential amplification by the differential input stage resulting in the amplifier current gain being a more direct function of just the ratio of the integrated circuit resistors.

20 Claims, 1 Drawing Sheet

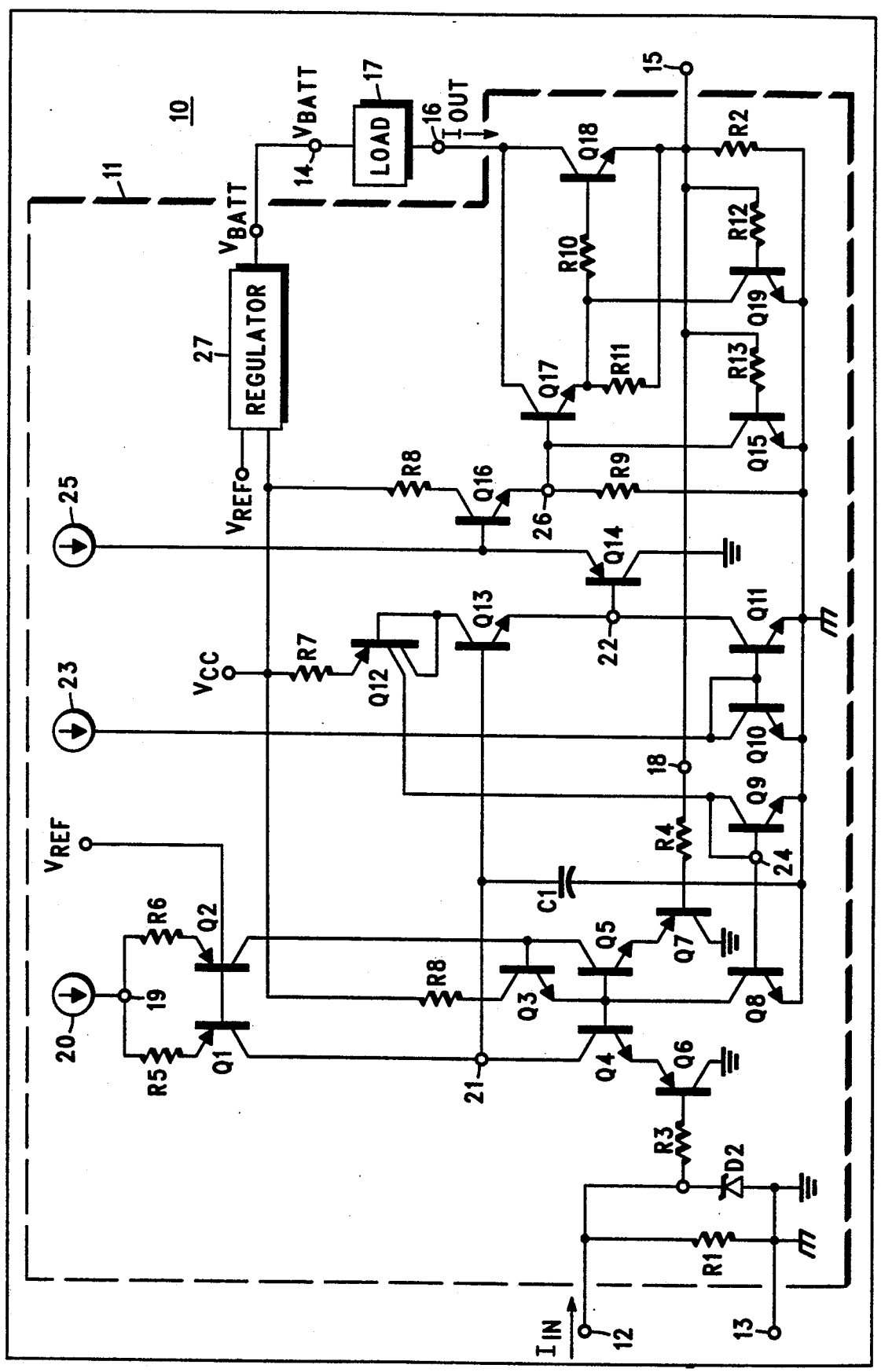

BALANCED INTEGRATED CIRCUIT DIFFERENTIAL AMPLIFIER

BACKGROUND INFORMATION

1. Field of the Invention

The present invention relates to the field of integrated circuit amplifiers. More particularly, the present invention relates to such amplifiers having a differential amplifying stage in which a pair of semiconductor devices, having one electrode of each connected to each other, each receives an input signal at an input electrode and provides an amplified differential signal at at least one output electrode of the semiconductor devices, wherein the differential signal is a function of the difference between the received input signals.

2. Description of the Prior Art

Integrated circuit differential amplifiers are known in which a pair of transistors is connected in either a common base or common emitter configuration so as to function as a differential amplifier. In such amplifiers the voltage produced at a collector electrode of one of the transistors is related to the amplified difference between input signals received at input electrodes of the pair of transistors. In such amplifiers, typically substantially identical biasing circuitry is utilized in order to attempt to equally bias each of the pair of differential amplifier transistors. The amplified differential signal is then coupled as an input to an output stage which typically has a high input impedance and low current loading effect so as to prevent any substantial loading at the collector at which the amplified differential signal is provided. However, it has been determined that even under such conditions, conduction of the output stage may cause sufficient impedance and current loading to effectively unbalance the differential amplifier pair of transistors. Attempting to rebalance this structure by providing an additional fixed impedance and current load to the collector of the differential pair which does not provide the differential signal to the output stage would only achieve desired balancing for one level of conduction of the output stage. Thus the differential stage would not be balanced for other output stage conduction levels.

Unbalanced operation of the differential pair of transistors means that the resultant differential signal will now not be a true differential signal but will have an offset, or error, variation which will vary in accordance with the impedance and current loading of the output stage. This may be just a minor effect if there is always an appreciable difference between the two different applied input signals being amplified. However, when these signals are approximately equal to each other, the loading effect of the output stage may be sufficient to provide differences in the turn-on (base-emitter) thresholds of the differential amplifying transistors. This can lead to an appreciable error or offset in the amplified differential signal.

OBJECTS OF THE INVENTION

An object of the present invention is to provide an improved integrated circuit differential amplifier stage wherein conduction of an output stage does not have an appreciable effect on the offset or error variation of the amplified differential signal.

A more particular object of the present invention is to provide an improved integrated circuit amplifier having a differential stage. The amplifier includes a high negative gain feedback path such that unity voltage or current gain is achieved for a received input signal. In the amplifier, operation of an input differential amplifying pair of transistors is balanced such that offset variation of the amplified differential signal is minimize as a function of conduction of an output stage which receives the amplified differential signal.

BRIEF DESCRIPTION OF THE DRAWING

The present invention can be better understood by reference to the drawing in which the FIGURE comprises a schematic diagram of an integrated circuit amplifier constructed in accordance with the present invention.

DESCRIPTION OF THE PREFERRED EMBODIMENTS

Referring to the FIGURE a schematic diagram of an integrated circuit differential current amplifier 10 is illustrated. The amplifier includes an integrated circuit 11 (shown in dashed outline) having a current input terminal 12, a ground terminal 13, a $V_{BATT}$ power supply terminal 14, a current monitor terminal 15 and an output terminal 16 each corresponding to an external lead of the integrated circuit 11. A load 17 is connected between the terminals 14 and 16 through which an output current $I_{out}$ is provided by the integrated circuit 11. The output current $I_{out}$ corresponds to an amplified version of an input current $I_{in}$ received at the input terminal 12. The current gain of the amplifier 10, due to its configuration as a unity voltage gain current amplifier having a high gain negative feedback path, is determined by the ratio of a relatively large integrated circuit resistor $R_1$ divided by a relatively small integrated circuit resistor $R_2$.

The amplifier 10 essentially implements an overall unity voltage gain for the voltage signal at terminal 12 and provides the voltage signal at the terminal 15 which is substantially equal to the terminal 12 voltage signal. However, amplifier 10 implements a substantial current gain (Iout/Iin) since R1 may have a typical magnitude of 2200 ohms and R2 may have a magnitude of 0.2 ohms. The resistors R1 and R2 are both preferably formed on the integrated circuit 11 in an N+ epitaxial layer, and therefore their ratios can be closely controlled resulting in close control of the overall current gain of the amplifier 10. The resistor R1 is directly connected between the terminals 12 and 13 and the resistor R2 is directly connected between the terminal 15 and ground. Preferably, the load 17 is a coil of a solenoid, but other loads can be utilized with the amplifier configuration shown.

An overvoltage protecting zener diode D2 prevents any excessive positive voltage from being provided at the input terminal 12. This terminal is connected through a resistor R3 to the base of a PNP transistor Q6 having its collector connected to ground and its emitter connected to the emitter of NPN transistor Q4. The base of the transistor Q4 is connected to the base of an NPN transistor Q5 having its emitter connected to the emitter of a PNP transistor Q7 which has its collector connected to ground and its base connected to an input terminal 18 through a resistor R4. Biasing collector current is provided to the collectors of the transistors Q4 and Q5 by biasing current mirror circuitry comprising a pair of PNP transistors Q1 and Q2 which have their bases coupled together and coupled to a voltage reference terminal $V_{ref}$ at which a potential of 3.0 volts is provided. The collector of transistor Q1 is connected to the collector transistor Q4 and the collector of transistor of Q2 is connected to the collector of transistor Q5. The emitters of the transistors of Q1 and Q2 are coupled through equal value resistors R5 and R6 to a terminal 19 which receives a predetermined current of 3.0 micro amps from a constant current source 20. The collector of the transistor Q4 corresponds to an output terminal 21 of a differential amplifier input stage which includes the transistors Q4 and Q5 wherein the signal at the terminal 21 is a differential signal related to the difference between the input signals provided at the emitters of these transistors.

The terminal 21 is connected to ground through a small value oscillation suppressing capacitor C1 and is directly connected to the base of an NPN output stage transistor Q13. The transistor Q13 amplifies the differential signal at the terminal 21 and provides the amplified differential signal as an output signal at an output terminal 22 corresponding to the emitter of this transistor. The terminal 22 is connected to the collector of an NPN transistor Q11 having its emitter connected to ground and its base directly connected to the base and collector electrodes of a transistor Q10. The transistor Q10 has its emitter connected to ground and its collector connected for receiving current from an 11.0 micro amp constant current source 23. The collector of the transistor Q13 is directly connected to the base and one collector electrode of a multiple (two) collector PNP transistor Q12. The emitter of transistor Q12 is connected through a resistor R7 to a reference voltage terminal $V_{cc}$ at which a constant voltage potential of 5.0 volts is maintained. Another of the collector electrodes of the transistor Q12 is connected to the base and collector electrodes of NPN transistor Q9 which has its emitter connected to ground. Transistor Q9 develops a current mirror voltage at its base electrode which is also designated by the reference terminal 24. The terminal 24 is connected to the base electrode of an NPN transistor Q8 which has its emitter connected to ground and its collector connected to the common base connection of the transistors Q4 and Q5. An NPN load balance transistor Q3 has its emitter connected to the common base connection of the transistors Q4 and Q5, its base connected to the collector of transistor Q5 and its collector connected through a resistor R8 to the voltage reference terminal VCC.

Essentially, the above described components form a differential amplifier input stage which includes the transistors Q4 and Q5. This input stage receives two input signals at the emitters of the transistors Q4 and Q5. These input signals correspond to the input signals provided at the terminals 12 and 18. The input stage provides a differential signal at the terminal 21. The output transistor Q13 essentially acts as an emitter follower stage to provide a buffered output voltage at its output terminal 22. An 11 micro amp biasing current is provided for the transistor Q13 by virtue of the current mirror action of the transistors Q10 and Q11. The current through transistor Q11 must match the current through transistor Q10 since both have equal base emitter bias, and the Q10 through current corresponds to the 11 micro amp current provided by the current source 23.

The current through the output transistor Q13 represents the collector current from one of the two collectors of the multiple collector transistor Q12. An identical current is provided in the other collector of the transistor Q12. This identical current is used to create a current mirror voltage at the terminal 24 which results in providing an identical current through the transistor Q8. Since the transistors Q4 and Q5 draw negligible base current, this current through the transistor Q8 will also substantially correspond to the current through transistor Q3. This results in the transistor Q3 providing, via its base connection, a substantially identical impedance and current load for the collector of the transistor Q5 as is provided by the connection of the base of the transistor Q13 to the collector of the transistor Q4.

The result of the above noted connections is that the loading effect of the output stage transistor Q13 on the collector of the transistor Q4 is essentially identically balanced by the loading effect of the transistor Q3 on the collector of the transistor Q5. What this means is that any changes in the conduction of the output stage transistor 13 will result in identical impedance and current load changes at the collectors of each of the transistors Q4 and Q5. This insures equal loading for the collectors of each of the differential transistors Q4 and Q5 and results in minimizing the offset variation which may exist between these transistors due to conduction of the transistor Q13.

Essentially, the signal at the terminal 21 represents the difference between the input signals at the terminals 12 and 18 multiplied by a gain factor. However, the signal at the terminal 21 also represents any differences due to unequal loading for the differential pair of transistors Q4 and Q5. The present invention effectively implements identical loading such that the voltage at the terminal 21 will now be representative of the true difference between the signals at the terminals 12 and 18 despite any loading effects of the transistor Q13 since an identical loading effect is provided by the transistor Q3. This loading effect can lead to an appreciable offset error if the signals at the terminals 12 and 18 are substantially equal. In that case, very minor differences between the base emitter thresholds of the transistors Q4 and Q5 could result in a substantial offset or error for the signal at the terminal 21. Unequal loading of the collector circuits of the transistors Q4 and Q5 can result in slightly different base emitter turn-on thresholds for the transistors Q4 and Q5. This effect is substantially eliminated by the present invention for an entire range of conduction of the output stage transistor Q13. This is far superior to merely providing some fixed load for the collector of the resistor Q5 wherein this fixed load would not vary identically in accordance with the conduction of the output stage transistor Q13. Note that transistors Q3 and Q8, besides implementing equal loading for the collector of Q5, also provide the base bias circuit path needed for the transistors Q4 and Q5. Thus additional base bias circuitry for Q4 and Q5 is not needed. Also, note that the load balancing of Q4 and Q5 by transistor Q3 is needed despite the fact that transistors Q1 and Q2 attempt to provide equal collector currents to the transistors Q4 and Q5.

While the above advantages of the present invention are applicable to any differential amplifier stage, the preferred embodiment of the present invention utilizes such a differential amplifier stage for a unity voltage gain amplifier having negative feedback wherein amplifier current gain is determined by the ratio of the semiconductor resistors R1 and R2. This is accomplished in the following manner.

The output stage output signal at the terminal 22 is connected to the base of a first amplifying PNP transistor Q14 which receives bias current from a 100 micro amp constant current source 25. The transistor Q14 acts as a voltage follower stage. A subsequent NPN transistor Q16 essentially acts as an emitter follower amplifier stage to provide an amplified signal at a terminal 26. NPN transistors Q17 and Q18 are arranged substantially in a Darlington type configuration with these transistors having their collectors connected together. The base of the transistor Q17 is directly connected to the terminal 26. The emitter of the transistor Q17 is connected through a resistor R10 to the base of the transistor Q18. The collectors of the Darlington transistors Q17 and Q18 are connected together and essentially form a current output terminal 16 of the integrated circuit 11 at which the output current $I_{out}$ is provided. The emitter of the transistor Q18 is connected through the resistor R2 to ground and a resistor R11 is connected between the emitters of the transistors Q17 and Q18.

A pair of overcurrent control or shut-off stages is provided with one of these stages comprising a resistor R12 connected between the current monitor terminal 15 and the base of an NPN transistor Q19 having its emitter connected to ground and its collector connected to the emitter of Q17. Another overcurrent control stage comprises a resistor R13 connected between the terminal 15 and the base of an NPN transistor Q15 having its emitter connected to ground and its collector connected to the terminal 26. Essentially, each of the pair of overcurrent stages, which stages include the transistors Q15 and Q19, act to reduce the current Iout if an excessive Iout current exists which results in the voltage across the resistor R2 being high enough to turn-on one or more of the transistors Q15 or Q19. In such a case, the transistors Q15 and Q19 act to rapidly reduce the current $I_{out}$ below the overcurrent level which is effectively sensed by the voltage across resistor R2. By using the two overcurrent control circuits connected as described herein, conduction of the Darlington stage is more rapidly reduced when overcurrent is sensed. The current sensing voltage across the resistor R2 is provided at the terminal 15. This terminal is directly connected to the input terminal 18 of the input differential amplifier stage.

The load 17, as previously stated, is connected between the battery terminal 14 and the output terminal 16 with the load current $I_{out}$ being drawn therethrough. The battery terminal 14 is provided as an input to the integrated circuit 11, and more specifically is provided as an input to a voltage regulator circuit 27 provided within the integrated circuit 11. The regulator circuit 27 receives battery voltage and provides the 5 volt reference voltage at the terminal VCC as well as the 3 volt reference voltage at the terminal $V_{ref}$. The regulator circuit 27 merely comprises conventional integrated circuit regulator circuitry to provide the desired reference voltages. Thus further detailed explanation of this component is not necessary. Portions of the regulator circuit 27 may be provided external to the integrated circuit 11, if desired.

Essentially, the components connected between the terminals 12 and 18, comprising the transistors Q6, Q4, Q13 and Q14 through Q19, implement a high gain negative feedback path for the amplifier 10. This feedback path results in the amplifier 10 providing unity voltage gain with regard to the voltage at the terminal 12 compared to the voltage at the terminal 15. Thus the differential amplifier stage, which includes the transistors Q4 and Q5, will be amplifying voltages provided at the input terminals 12 and 18 which are substantially identical in magnitude. This makes any loading effect caused by the transistor Q13 critical in that this loading effect should be balanced in order to provide an accurate output result. Note that the amplifier 10 configuration in the drawing results in the same DC level being provided at each of the terminals 12 and 18 due to the cancelling of transistor $V_{BE}$'s.

Because a unity voltage gain is provided for the signals at the terminals 12 and 15, the amplifier 10 essentially works by taking the voltage between the terminals 12 and 13, using this voltage to provide an input current $I_{in}$ by applying this voltage across the resistor R1, then effectively applying substantially the same voltage across the much lower resistance R2 resulting in the much larger output current $I_{out}$. Thus the amplifier 10 functions as an unity voltage gain but high current gain amplifier. The balanced loading of the collectors of the differential amplifier input stage, which includes the transistors Q4 and Q5, means that the gain of the current amplifier will be substantially determined just by the ratio of the resistors R1 and R2. This gain will be substantially independent of transistor beta (current gain) factors and transistor loading effects, such as the impedance and current loading effect of the output stage transistor Q13. Thus a highly stable current amplifier gain will be implemented determined by the ratio of the resistors R1 and R2. Since these resistors are preferably semiconductor resistors formed in the integrated circuit 11, the ratio of these resistors can be very closely controlled resulting in a very stable and accurately controlled current amplifier.

While I have shown and described specific embodiments of this invention, further modifications and improvements will occur to those skilled in the art. Obviously, many of the same principles and advantages of the present invention will apply if the differential input stage consisted of a pair of transistors arranged in a common emitter, instead of the common base configuration shown for transistors Q4 and Q5. Also, certain features of the present invention can be readily implement in PNP, rather than NPN, transistors were utilized, or vice vera. In addition, equivalent circuits utilizing MOS or field-effect transistors can be constructed so as to achieve many of the same benefits achieved by the present invention. All such modifications which retain the basic underlying principles disclosed and claimed herein are within the scope of this invention.

I claim:

1. An integrated circuit differential amplifier comprising:

differential input stage means including at least a pair of first and second semiconductor devices each having an input electrode, an output electrode and a common electrode, the common electrodes being connected to each other, said input stage means providing at one of said output electrodes a differential signal related to the difference between two input signals each separately coupled to a different one of said input electrodes;

output stage means having an input terminal connected to said one output electrode of said input stage means for amplifying said differential signal and providing said amplified differential signal as an output signal at an output terminal of said output stage means, said output stage means inherently providing a predetermined impedance and current load at said one output electrode of said input stage means by virtue of its connection thereto, wherein the improvement comprises, current mirror circuitry for developing a current mirror signal substantially corresponding to output current drawn through said output stage means regardless of any current drawn by any additional circuitry connected to said output terminal; and load balancing circuit means having current there through determined by said current mirror signal and having an input terminal directly coupled to and loading another one of said input stage output electrodes, wherein said balancing circuit means provides at its input terminal an impedance and current load substantially identical to the impedance and current load provided by said output stage means regardless of any current drawn by any additional circuitry connected to said output terminal, whereby offset variation of said differential signal as a function of conduction of said output stage means is reduced.

2. An integrated circuit differential amplifier according to claim 1 wherein said first and second semiconductor devices are identical type semiconductor devices with identical type corresponding input, output and common electrodes.

3. An integrated circuit differential amplifier according to claim 2 wherein said first and second semiconductor devices are transistors, said common electrodes are base electrodes, said input electrodes are emitter electrodes and said output electrodes are collector electrodes.

4. An integrated circuit differential amplifier according to claim 3 wherein said output stage means includes an output transistor having its base connected to said one output electrode, said output transistor amplifying said differential signal and providing said amplified differential signal as said output signal at one of its collector and emitter electrodes.

5. An integrated circuit differential amplifier according to claim 4 wherein said load balancing circuit means includes a load balance transistor having its base connected to said another one of said output electrodes of said input stage means, current through said load balance transistor determined by said current mirror signal and being substantially equal to current through said output transistor.

6. An integrated circuit differential amplifier according to claim 5 wherein said output stage means includes a multiple collector transistor having one collector electrode providing current to said output transistor and another collector electrode providing a predetermined related current to a diode connected transistor which is part of said current mirror circuitry and which develops said current mirror signal in response thereto.

7. An integrated circuit differential amplifier according to claim 6 wherein said first and second transistors and said output and load balance transistors are all NPN transistors.

8. An integrated circuit differential amplifier according to claim 1 wherein said output stage means includes an output transistor having a control electrode directly connected to said one output electrode of said differential input stage means, said output stage means output transistor amplifying said differential signal and providing said amplified differential signal as said output signal at an output electrode thereof.

9. An integrated circuit differential amplifier according to claim 8 wherein said load balancing circuit means includes a load balance transistor of the same type as said output stage means output transistor, said load balance transistor having a control electrode, of the same type as the control electrode of said output stage means output transistor, connected to said another one of said output electrodes of said differential input stage means, current through said load balance transistor being determined by said current mirror signal and being substantially equal to current through said output stage means output transistor.

10. An integrated circuit differential amplifier according to claim 9 wherein said output stage means includes a current source transistor having multiple electrodes of the same type, one of said multiple electrodes providing current to said output stage output transistor and another of said multiple electrodes providing a predetermined related current to a diode connected transistor which is part of said current mirror circuitry and which develops said current mirror signal in response thereto across said diode connected transistor.

11. An integrated circuit amplifier comprising:

differential input stage means including at least a pair of first and second semiconductor devices each having an input electrode, an output electrode and a common electrode, the common electrodes being connected to each other, said input stage means providing at one of said output electrodes a differential signal related to the difference between two input signals each separately coupled to a different one of said input electrodes;

output stage means having an input terminal connected to said one output electrode of said input stage means for amplifying said differential signal and providing said amplified differential signal as an output signal at an output terminal of said output stage means, said output stage means inherently providing a predetermined impedance and current load at said one output electrode of said input stage means by virtue of its connection thereto, said amplifier including an input resistor, the voltage across which determines one of said input signals, and including an output resistor, the voltage across which determines another one of said input signals, said output resistor coupled to said output stage, said amplifier providing a voltage across said output resistor substantially equal to the voltage applied across said input resistor, the current gain of said amplifier being substantially equal to the ratio of said output and input resistors with said amplifier providing unity gain for the voltage across said output resistor with respect to the voltage across said input resistor;

current mirror circuitry for developing a current mirror signal substantially corresponding to output current drawn through said output stage means; and load balancing circuit means having current there through determined by said current mirror signal and having an input terminal directly coupled to and loading another one of said input stage output electrodes, wherein said balancing circuit means provides at its input terminal an impedance and current load substantially identical to the impedance and current load provided by said output stage means, whereby offset variation of said differential signal as a function of conduction of said output stage means is reduced.

12. An integrated circuit amplifier according to claim 11 wherein one of said differential input stage means input electrodes is coupled to an externally supplied input signal which determines the voltage across said input resistor, and wherein said amplifier includes a high gain negative feedback circuit path from said one of said input stage means electrodes to another one of said input electrodes, the voltage at said another one of said input electrodes of said differential input stage means being provided by said feedback path and being substantially equal in magnitude to the voltages across said input and output resistors.

13. An integrated circuit amplifier according to claim 12 wherein said input and output resistors are formed on an integrated circuit which includes said differential input stage means, said output stage means, said current mirror circuitry, and said load balancing circuit means.

14. An integrated circuit amplifier according to claim 11 wherein said output stage means includes an output transistor having a control electrode directly connected to said one output electrode of said differential input stage means, said output stage means output transistor amplifying said differential signal and providing said amplified differential signal as an output signal at an output electrode thereof.

15. An integrated circuit amplifier according to claim 14 wherein said load balancing circuit means includes a load balance transistor of the same type as said output stage means output transistor, said load balance transistor having a control electrode, of the same type as the control electrode of said output stage means output transistor, connected to said another one of said electrodes of said differential input stage means, current through said load balance transistor being determined by said current mirror signal and being substantially equal to current through said output stage means output transistor.

16. An integrated circuit amplifier according to claim 15 wherein said output stage means includes a current source transistor having multiple electrodes of the same type, one of said multiple electrodes providing current to said output stage output transistor and another of said multiple electrodes providing a predetermined related current to a diode connected transistor which is part of said current mirror circuitry and which develops said current mirror signal in response thereto across said diode connected transistor.

17. An integrated circuit amplifier according to claim 11 which includes a pair of Darlington connected transistors connected to said output stage means for receiving said output signal and providing said voltage across said output resistor in response thereto.

18. An integrated circuit amplifier according to claim 17 which includes first and second overcurrent protection circuit means each monitoring the voltage across said output resistor and each separately coupled to a different one of the base electrodes of each of said Darlington transistors for reducing conduction of said Darlington transistors in response to sensing excessive current through said output resistor.

19. An integrated circuit differential amplifier comprising:

differential input stage means including at least a pair of first and second semiconductor devices each having an input electrode, an output electrode and a common electrode, the common electrodes being connected to each other, said input stage means providing at one of said output electrodes a differential signal related to the difference between two input signals each separately coupled to a different one of said input electrodes;

output stage means having an input terminal connected to said one output electrode of said input stage means for amplifying said differential signal and providing said amplified differential signal as an output signal at an output terminal of said output stage means, said output stage means inherently providing a predetermined impedance and current load at said one output electrode of said input stage means by virtue of its connection thereto, wherein the improvement comprises, current mirror circuitry for developing a current mirror signal substantially corresponding to output current drawn through said output stage means; and load balancing circuit means having current there through determined by said current mirror signal and having an input terminal directly coupled to and loading another one of said input stage output electrodes, wherein said balancing circuit means provides at its input terminal an impedance and current load substantially identical to the impedance and current load provided by said output stage means, whereby offset variation of said differential signal as a function of conduction of said output stage means is reduced, wherein said output stage means includes an output device having a control electrode directly connected to said one output electrode of said differential input stage means, said output stage means output device amplifying said differential signal and providing said amplified differential signal as said output signal at an output electrode thereof, wherein said load balancing circuit means includes a load balance device of the same type as said output stage means output device, said load balance device having a control electrode, of the same type as the control electrode of said output stage means output device, connected to said another one of said output electrodes of said differential input stage means, current through said load balance device being determined by said current mirror signal and being substantially equal to current through said output stage means output device, and wherein said output stage means includes a current source device having multiple electrodes of the same type, one of said multiple electrodes providing current to said output stage output device and another of said multiple electrodes providing a predetermined related current to a diode connected transistor which is part of said current mirror circuitry and which develops said current mirror signal in response thereto across said diode connected transistor.

20. An integrated circuit differential amplifier according to claim 19 wherein said current source device comprises a current source transistor.

* * * * *